United States Patent [19]

Basi et al.

[11] 3,869,324

[45] Mar. 4, 1975

[54] METHOD OF POLISHING CADMIUM TELLURIDE

[75] Inventors: Jagtar Singh Basi, Wappingers Falls; Eric Mendel, Poughkeepsie, both of N.Y.

[73] Assignee: International Business Machines Corporation, Armonk, N.Y.

[22] Filed: Dec. 28, 1973

[21] Appl. No.: 429,420

[52] U.S. Cl. .......... 156/17, 156/20, 252/79.5

[51] Int. Cl. .......... H01l 7/50

[58] Field of Search ....... 156/17, 20; 252/79.1, 79.5

[56] References Cited

UNITED STATES PATENTS

| | | | |
|---|---|---|---|
| 2,690,383 | 9/1954 | Bradshaw | 156/17 |
| 2,822,250 | 2/1958 | DeNobel | 156/17 |
| 3,143,447 | 8/1964 | Norr | 156/17 |
| 3,342,652 | 9/1967 | Reisman et al. | 156/17 |
| 3,429,756 | 2/1969 | Groves | 156/17 |
| 3,629,023 | 12/1971 | Strehlow | 156/17 |
| 3,775,201 | 11/1973 | Basi | 156/17 |

*Primary Examiner*—William A. Powell
*Attorney, Agent, or Firm*—Sughrue, Rothwell, Mion, Zinn & Macpeak

[57] ABSTRACT

Cadmium telluride with damage-free surfaces is obtained by chemically-mechanically polishing using a chemical polishing system including a stable, water soluble alkali metal or alkaline earth metal hypohalite and an alkali metal carbonate; the alkali metal carbonate must be present in at least equimolar proportions to the hypohalite.

10 Claims, No Drawings

METHOD OF POLISHING CADMIUM TELLURIDE

BACKGROUND OF THE INVENTION

1. Field of the Invention

This invention relates to a process for polishing cadmium telluride surfaces to a high degree of surface perfection.

2. Description of the Prior Art

Semiconductor devices such as integrated monolithic circuits, diodes, passive devices, and the like, are formed by various additive techniques, such as diffusion and epitaxial growth in the planar surfaces of semiconductor materials. Cadmium telluride is a well-known material utilized for the manufacture of such devices. The perfection of the cadmium telluride surface in regard to surface fine-structure conditions down to an order of Angstrom units, surplus planarity, uniformity and freedom of mechanical damage and flatness is a fundamental requirement for the manufacture of semiconductor devices.

It is advantageous and desirable to have cadmium telluride wafers or slices having highly polished surfaces prior to the performance of processing steps where effectiveness may be decreased by the presence of undesirable surface conditions and contaminants. Such processing steps might include, for example, the formation of epitaxial layers on the slice, the controlled diffusion of impurities into the slice or thermal treatment or final encapsulation of the device.

The surface planarity of the wafer is critical in photolithographic masking techniques because of the constant effort to decrease the physical size of the device. Any increase in distance between the mask and the wafer surface caused by significant deviations from the ideally planar wafer unfavorably effects the image resolution of fine device structure on the surface of the wafer. Poor device yields are the result at the periphery of the wafer where a non-planary becomes more pronounced as one proceeds towards the edge or outside periphery of the wafer for device formation. The surface fine-structure characteristics over the entire wafer is also an extremely important characteristic as it can produce poor devices throughout the wafer. Mechanical or physical defects and irregularities in the planar wafer surface also produce marginal or useless devices throughout the entire surface which also can result in a waste of manufacturing time and excess cost due to low yield. Damage-free surfaces are especially important where the optical properties of cadmium telluride are to be utilized.

The prior art has suggested mechanical polishing and chemical etching in order to obtain a damage-free cadmium telluride surface.

Usual mechanical polishing procedures involve a series of abrading and polishing steps using polishing ingredients of graduated fineness. In this manner, most surface scratches can be removed, however, damage to the cadmium telluride crystal structure just below the surface caused by preceding courser mechanical polishing steps cannot be removed.

These defects are encountered in the mechanical polishing techniques using a fine diamonnd paste, the most commonly used technique in the prior art. Substitution of alumina grit, Syton [a silicon dioxide based slurry] or $ZrSiO_2$ for the diamond paste has been attempted, but has not overcome this inherent defect of such processes.

Attempts by the inventor to chemically etch cadmium telluride using various systems such as $HNO_3$—$HCl$—$HF$; $HNO_3$—$HCl$—$H_2O_2$; $HNO_3$—$H_2O$—$K_2Cr_2O_7$; $Br_2$—$CH_3OH$; $H_2O$—$NH_4OH$; $H_2O_2$—$Na_2CO_3$; $H_2O_2$—$NaOH$ and the like were also unsuccessful. The most typical defect illustrated by such chemical etching procedures has been the formation of black reactants on the surface of the cadmium telluride, uneven etching or vigorous surface dissolution leading to a very rough surface.

U.S. Pat. No. 3,738,882 Basi discloses that gallium arsenide can be polished using sodium hypochlorite and sodium carbonate. There is no suggestion in this patent of the chemical-mechanical polishing of cadmium telluride nor is there any suggestion of the surprisingly superior results which are obtained with alkali metal hypobromites, especially sodium hypobromite, when used to polish cadmium telluride in accordance with the present invention.

It is also known that gallium phosphide can be polished using an oxybromide solution. There is no suggestion that the systems disclosed would have any use in the polishing of cadmium telluride to obtain cadmium telluride planar surfaces of a high degree of surface perfection.

SUMMARY OF THE INVENTION

It is an object of this invention to provide a method for polishing cadmium telluride surfaces to a high degree of perfection.

It is a further object of this invention to provide a method or process for obtaining high quality damage-free planar polishes on both single crystal and polycrystalline cadmium telluride crystallographic orientations.

It is another object of this invention to provide a process which enables polishing of cadmium telluride independent of conductivity type to produce a highly polished featureless planar surface.

These and other objects of the present invention are realized by chemically-mechanically polishing cadmium telluride using an aqueous solution of an alkali or alkaline earth metal hypohalite which contains an equimolar or greater amount of an alkali metal carbonate (based on the hypohalite).

The present invention is specific to chemical-mechanical polishing. The basic mechanism of chemical-mechanical polishing differs substantially from either mechanical polishing or chemical etching. For example, in the chemical-mechanical polishing of cadmium telluride, the alkali or alkaline earth metal hypohalite chemical polishing solution reacts with the cadmium telluride wafer surface, whereafter the reaction product is "loosened" by the alkali metal carbonate and removed by the polishing cloth (mechanical polishing) to expose fresh cadmium telluride which is, in turn, subjected to the described reaction/removal procedure.

DETAILED DESCRIPTION OF THE INVENTION

The cadmium telluride surface which is generally used as a starting material in the chemical-mechanical polishing process of the present invention is not limited as to form or crystallographic structure, so long as a planar surface is presented, but generally it is in the form of a thin wafer. The wafers are usually sawed from cylinders of cadmium telluride and lapped on a lapping machine using a fine abrasive. At this stage, the cadmium telluride wafer surface is fairly uniform but is mechanically damaged. The polishing procedure of the present invention is generally initiated subsequent to such pre-polishing. While pre-polishing is not necessary, on a commercial scale it is beneficial to pre-polish so the chemical-mechanical polishing of the present invention need be used only for the final critical polishing stages.

The chemical-mechanical polishing technique of the present invention can be practiced using conventional apparatus available to the art. For example, the polishing apparatus as disclosed in U.S. Pat. No. 3,436,259 Regh et al. can be used with success in the present invention.

In general, the polishing apparatus includes a bowl having a fluid inlet and fluid outlet and a plate. Mounted on the plate by any suitable means is a soft, firm polishing surface. A smaller plate containing the cadmium telluride wafers to be polished is mounted below the first plate by any suitable adhesive or other method. The smaller plate with the cadmium telluride wafers mounted thereon is urged against the polishing surface in an upward manner. Illustrative of suitable polishing surfaces are the Politex materials which are available from Geos, Mt. Vernon, N.Y. While either of both plates can be driven, generally the driven plate is the upper plate with the polishing surface. It is rotated and the cadmium telluride wafers are passed under and in contact with the polishing surface. Simultaneous with the relative motion of the cadmium telluride wafers and their contact with the polishing surface the chemical polishing solution of the present invention is flowed over the wafers, typically by being dripped through the polishing surface which is porous, the cadmium telluride wafers being chemically-mechanically polished by their contact with the rotating polishing surface and the chemical polishing solution of the present invention.

Needless to say, the apparatus disclosed in U.S. Pat. No. 3,436,259 Regh et al. is merely one means for affecting the relative motion between the cadmium telluride wafers and the polishing surface while flowing the chemical polishing solution of the present invention thereover, and any equivalent apparatus can be used which permits these two functions to be achieved.

The essential constituents of the chemical polishing solution of the present invention are an alkali metal or alkaline earth metal hypohalite and an alkali metal, e.g., sodium carbonate.

Of the alkali metal hypohalites, sodium hypobromite is most preferred, offering results far superior to the other alkali metal hypohalites. The reasons for the superior results obtained using sodium hypobromite are not known. Logically, one would expect the alkali metal hypohalites to give substantially equivalent results. Hereafter, sodium carbonate will be exemplified, but it shall be understood the other alkali metal carbonates can be used.

The alkaline earth metal hypohalites are typified by calcium hypochlorite. They are not as effective as the alkali metal hypohalites and hence are non-preferred. Accordingly, the following discussion will be in terms of the alkali metal hypohalites, though it should be understood the discussion also applied to the alkaline earth metal hypohalites.

Sodium carbonate is a mandatory constituent in the chemical polishing solution. For some reason sodium bicarbonate does not illustrate an effect similar to that of sodium carbonate and can effectively be considered inert in the chemical polishing solution of the present invention. It can be present, but it has no beneficial impact except to neutralize strong bases. This is important because sodium hydroxide or other strong bases must be avoided in the chemical polishing solution of the present invention as their presence is detrimental to cadmium telluride surface quality in that strong bases etch rather than polish the cadmium telluride surface.

Considering the above factors, it is generally preferred that the pH of the chemical polishing solution of the present invention be maintained at above about 8, most preferably at a pH within the range of 9 to 11.

Hereafter, for purposes of brevity, the alkali metal hypohalite and alkali metal carbonate will be referred to as the "active components" of the chemical polishing solution of the present invention.

The active components of the present invention are used in the form of an aqueous solution. If desired, a portion of the water used to dissolve the active components of the present invention can be replaced by other organic or inorganic solvents which are inert to the active components and calcium telluride. Generally speaking, however, little is to be gained by adding other organic or inorganic solvents to the aqueous system of the present invention, and seldom will they be added.

In addition to the active components and solvent, inert additive materials can also be present in the chemical polishing solution. Such will not be purposefully added, of course, but if present exert no harmful effect.

Examples of such inert materials would be sulfates, nitrates, etc.

The amount of active components present in the chemical polishing solution of the present invention is not overly critical, but certain compositions where most preferred results are obtained do exist. Generally, the alkali metal hypohalite will be present at a concentration of from about 0.2 molar to about 0.8 molar with most preferred results being obtained when the alkali metal hypohalite is present in about 0.4 molar concentration.

Greater amounts of the alkali metal hypohalite can be used, of course, but at higher concentrations no substantial benefits are obtained as compared to the use of about 0.8 molar concentrations. At exceedingly high proportions of alkali metal hypohalite a slight tendency towards instability is noted, making reproducibility difficult. Considering this factor, seldom will such greater concentrations be used.

Conversely, if concentrations of alkali metal hypohalite much below about 0.2 molar are used, generally a decrease in chemical-mechanical polishing activity will be encountered, with lessening proportions of alkali metal hypohalite providing correspondingly less effective results. The difference is not one of kind, however; rather, it is a gradual lessening of effectiveness.

As will be apparent to one skilled in the art, if a near perfect cadmium telluride wafer is to be polished, i.e., only small amounts of material are to be removed, for instance, a few microns, a chemical polishing solution which contains mere traces of alkali metal hypohalite can act as an effective chemical-mechanical polishing agent.

The alkali metal carbonate must be present in amounts at least equimolar with respect to the alkali metal hypohalite. Greater amounts of alkali metal carbonate can be used, but the results obtained are not substantially better than those obtained at equimolar proportions. Generally, to allow a slight safety factor, amounts of alkali metal carbonates slightly in excess of equimolar are used. Sodium carbonate is the preferred alkali metal carbonate and will generally be used. The alkali metal carbonate serves to "loosen" the reaction film formed by the alkali metal hypohalite acting upon the cadmium telluride, and enhances removal thereof by the polishing pad.

The exact flow rate of the chemical polishing solution over the cadmium telluride wafers will, of course, vary greatly depending upon the amount of polishing to be accomplished on a specific set of cadmium telluride wafers, the polishing pressure, the amount of active components present and other factors. The only important criterion which must be observed is that sufficient chemical polishing solution must always be present so that reaction with freshly exposed cadmium telluride is insured as reaction product is removed by the mechanical polishing. Establishing the exact flow rate used will be well within the skill of the art and can be accomplished merely by a few trial process runs, usually starting with a low flow rate of the chemical polishing solution and increasing the flow rate until the desired chemical-mechanical polishing is obtained.

For most preferred commercial operations, usually the flow rate of the chemical polishing solution will be from about 4 ml/min. to about 50 ml/min. per micron of cadmium telluride to be removed.

In the chemical-mechanical polishing of cadmium telluride one must maintain relative motion between the cadmium telluride wafer surface being polished and the polishing surface, but the exact pressure maintained between the cadmium telluride wafer surface and the polishing surface is not overly important. However, as with most processes a preferred range of operation does result, and in the present instance most preferably the pressure between the cadmium telluride wafer surface and the polishing surface is maintained within the range of from about 80 to 100 $g/cm^2$ of polished wafer surface.

Decreasing pressures lower the rate of chemical-mechanical polishing and increasing pressures increase the rate of chemical-mechanical polishing.

By following the above general guidelines on the pressure of chemical-mechanical polishing and on chemical polishing solution flow rates, cadmium telluride wafers can be efficiently polished to have a damage-free, substantially perfect surface at cadmium telluride removal rates of on the order of 2–5 mils/hr. or higher. Lower removal rates can be obtained, of course, but little is to be gained in improving product quality by using such lower rates and the time of chemical-mechanical polishing is increased, a disadvantage to processing on a commercial scale.

The chemical-mechanical polishing of the present invention is generally performed at ambient temperature and with a system open to the atmosphere, though of course there is nothing in the mechanism of the polishing procedure to prohibit the use of higher or lower temperatures and/or pressures, if one desires to use the same.

The rate of relative rotation between the cadmium telluride wafer surface and the polishing surface is in accordance with prior art procedures and is not overly important. Most commercially available polishing devices as are used in practicing the present invention operate over the rotation range of about 30 to about 100 r.p.m. using a 12 inch polishing wheel and good results are obtained over this entire range.

The final step in the process of the present invention is preferably to free the polished surface of the cadmium telluride wafers of any residual chemical polishing solution. This is performed in a simple manner by replacing the flow of chemical polishing solution with a flow of a non-polishing medium, such as water, whereafter the polished cadmium telluride wafers having a damage-free surface can be removed from the polishing apparatus.

Having thus discussed the invention in general, the following working examples illustrate specific procedures affected utilizing the chemical-mechanical polishing techniques of the present invention. Unless otherwise indicated, all percentages and parts are by weight.

Eight polycrystalline cadmium telluride wafers approximately ¼ inch thick and having a wafer surface area to be polished of 2.00 sq. inc. each were polished in accordance with the present invention. The cadmium telluride wafers were intially lapped with alumina grit using state-of-the-art techniques.

The apparatus described in U.S. Pat. No. 3,436,259 Regh et al. was utilized in combination with a Politex polishing cloth.

In this example the chemical polishing solution comprised an aqueous solution of NaOBr and $Na_2CO_3$, the NaOBr being present at a concentration of 0.4 molar and the $Na_2CO_3$ being equimolar thereto.

The chemical polishing solution was dripped onto the wafers through the polishing cloth at a rate of 30 cc/min. The wafers were mounted on a circular plate (12 inches in diameter) urged against the polishing cloth at a pressure of 90 $g/cm^2$ of exposed wafer surface, the plate being rotated at about 65 rpm.

After chemical-mechanical polishing under the above conditions for 1 hour, 2 mils of cadmium telluride were removed.

After 1 hour, dripping of the chemical polishing solution was terminated, the wafers washed with deionized water and then subjected to a nitrogen drying.

Chemical-mechanical polishing was at ambient temperature in a system open to the atmosphere.

Upon examination of the polished cadmium telluride wafers, they were determined to have a substantially perfect surface.

Though the cadmium telluride was polycrystalline, no preferential etching was encountered and even surface grain boundaries were destroyed. This result was quite surprising in view of the generally held belief in the art that polycrystalline materials cannot be successfully chemically-mechanically polished. No twinning was observed in the polished cadmium telluride wafers.

While the invention has been particularly shown and described with reference to the preferred embodiment thereof, it will be understood by those skilled in the art that various changes in form and details may be made therein without departing from the spirit and scope of the invention.

What is claimed is:

1. A method for the chemical-mechanical polishing of a cadmium telluride surface to a high degree of surface perfection comprising:

maintaining said cadmium telluride surface continuously wetted with an excess quantity of an aqueous chemical polishing solution comprising an alkali metal or alkaline earth metal hypohalite and an alkali metal carbonate, the alkali metal carbonate being at least equimolar to the alkali metal hypohalite; and continuously wiping the cadmium telluride surface with a firm surface using a substantial pressure while maintaining a relative movement between the cadmium telluride surface and the firm surface to remove the cadmium telluride from the high points of the cadmium telluride surface.

2. The process of claim 1, where the hypohalite is hypobromite.

3. The process of claim 2, where the alkali metal is sodium.

4. The process of claim 3, where sodium hypobromite is present at a concentration from about 0.2 molar to about 0.8 molar in the chemical polishing solution.

5. The process of claim 4, where the sodium hypobromite is present at a concentration of about 0.4 molar in the chemical polishing solution.

6. The process of claim 5, where the firm pressure is from about 80 to about 100 $gm/cm^2$ of cadmium telluride surface.

7. The process of claim 6, where the pH of the chemical polishing solution is above about 8.

8. The process of claim 7, where the chemical polishing solution is flowed over the cadmium telluride at a rate of about 4 to about 50 ml/min. per micron of cadmium telluride to be removed.

9. The process of claim 1, where the cadmium telluride is polycrystalline.

10. The process of claim 1, where the cadmium telluride is single crystal.

* * * * *